United States Patent
Chang

(12) 
(10) Patent No.: US 7,217,136 B2
(45) Date of Patent: May 15, 2007

(54) PRINTED CIRCUIT BOARD WITH RIGHT-ANGLED TRACE AND METHOD FOR MAKING THE SAME

(75) Inventor: Che-fu Chang, Kuei San Hsiang (TW)

(73) Assignee: Mitac International Corp., Taoyuan (TW)

( * ) Notice: Subject to any disclaimer, the term of this patent is extended or adjusted under 35 U.S.C. 154(b) by 0 days.

(21) Appl. No.: 11/293,196

(22) Filed: Dec. 5, 2005

(65) Prior Publication Data

US 2006/0128173 A1 Jun. 15, 2006

(30) Foreign Application Priority Data

Dec. 15, 2004 (TW) .............................. 93139021 A

(51) Int. Cl.
*H05K 1/00* (2006.01)
*H01G 4/228* (2006.01)

(52) U.S. Cl. .................... 439/63; 438/106; 438/110; 257/E21.337; 361/306.1

(58) Field of Classification Search ................. 438/26, 438/51, 55, 64, 100, 106, 110, 199, 63, 514, 438/532, 659, 684; 257/369, 754; 29/25.01, 29/829; 174/250; 337/297; 439/55, 63
See application file for complete search history.

(56) References Cited

U.S. PATENT DOCUMENTS 6,703,187 B2 * 3/2004 Sheu et al. ................. 430/314

* cited by examiner

*Primary Examiner*—James A. Reagan
*Assistant Examiner*—Anthony Ho
(74) *Attorney, Agent, or Firm*—Rabin & Berdo, P.C.

(57) ABSTRACT

A printed circuit board having right-angled trace and a method for making the right-angled trace is to apply semi-conductor material and form an interface with a P-type semi-conductive layer and a N-type semi-conductive layer. The semi-conductive right-angled interface does not reflect signals transmitting from the first line portion to the second line portion and via the right-angled portion so as to reduce signal reflection interference. The right-angled line arrangement also shortens the connection distance and reduces the circuit board dimensions.

18 Claims, 6 Drawing Sheets

PRINTED CIRCUIT BOARD WITH RIGHT-ANGLED TRACE AND METHOD FOR MAKING THE SAME

CROSS-REFERENCE TO RELATED APPLICATIONS

This Non-provisional application claims priority under 35 U.S.C. § 119(a) on Patent Application No(s). 093139021 filed in Taiwan on Dec. 15, 2004, the entire contents of which are hereby incorporated by reference.

FIELD OF THE INVENTION

The invention generally relates to a method for making trace, and in particular relates to a method for making right-angled trace by using semi-conductor material; and the printed circuit board made by the method.

BACKGROUND OF THE INVENTION

In accompany with developments in electronic industries, kinds of electronic products generate economic benefits and improve our daily lives. Currently, electronic products are getting shorter, smaller, lighter and thinner. In order to miniaturize the circuit boards of electronic products, the connection line between elements should be shortened. Though straight lines are the shortest, it is impossible to keep all the connection lines simply straight since the considerations of component locations, heat dissipation and signal interference problems. An easier way is to connect the components with straight lines and right-angled lines.

However, traces in right angles cause three effects: capacitor effect, electromagnetic interference and signal reflection. Signal reflection is especially evident when the electronic circuit is applied for high frequency signal transmission. As shown in FIG. 1A, an explanatory view of signal reflection in a right-angled portion, when signal 11 passes through the right-angled portion 10a of a circuit 10, the discontinuous impedance in the circuit 10 causes reflective noise signal 11. The reflective signal interferes the signal transmission and may even cause mistake or malfunction of the integrated circuit.

Conventional circuit layout for a right-angled portion 10a of a circuit 10 is arranged as shown in FIGS. 1B to 1D. In FIG. 1B, one side of the right-angled portion 10a is slant, while the other side is rectangular. Therefore, the slant portion in 45 degrees turns the signal path 90 degrees to reduce signal reflection. However, it relatively increases the path length and area of the circuit 10. In FIG. 1C, both sides of the right-angled portion are slants of 45 degrees to turn the signal path 90 degrees. The reflection reduction of FIG. 1C is better than that of FIG. 1B. However, it still increases the path length and area of the circuit 10. In FIG. 1D, both sides of the turning portion 10a are arcs to turn the signal path 90 degrees. The performance of reflection reduction is the best. However, the fabrication of the line is much difficult.

Therefore, to provide a trace method that can prevent signal reflection interference and reduce printed circuit board dimensions is a demand of manufacturers and technicians.

SUMMARY OF THE INVENTION

The object of the invention is to provide a method for making right-angled trace by using semi-conductor material. The interface characteristics of the semi-conductor material help the signal passing through the right-angled portion and transmitting toward a specific direction so as to reduce signal reflection interference and to save printed circuit board dimensions.

A method for making right-angled trace according to the invention applies a semi-conductive interface between a first line portion and a second line portion that form a right-angled portion so as to decrease signal reflection. The method includes the following steps:

First, applying first lithography on a semi-conductor substrate to form a first ion implant area of the first line portion of the right-angled portion. The process of first lithography is to form a photoresist layer on the lines; to shield the second line portion of the right-angled portion; to expose the photoresist layer of the first line portion; and to remove a part of the photoresist layer and get an area for ion implant of the first line portion by using chemical agent;

Then, implanting ions on the first ion implant area to form a first conductive type (for example, a P-type semi-conductive layer) portion; applying second lithography to form a second ion implant area of the second line portion of the right-angled portion. The process of second lithography is to form a photoresist layer on the lines; to shield the first line portion of the right-angled portion; to expose the photoresist layer of the second line portion; and to remove a part of the photoresist layer and get an area for ion implant of the second line portion by using chemical agent; further, implanting ions on the second ion implant area to form a second conductive type (for example, an N-type semi-conductive layer) portion.

A printed circuit board having right-angled trace according to the invention includes a substrate and a right-angled line layer. The substrate is a semi-conductor material. The right-angled line layer formed on the substrate includes a first line portion having a first conductive type (such as a P-type semi-conductive layer) portion and a second line portion connected to the first line portion. The second line portion has a second conductive type (such as an N-type semi-conductive layer) portion. The first and the second conductive type portions connect via a semi-conductive interface in a 45-degree angle.

The length of the first conductive type portion is smaller than or equal to the length of the first line portion. The length of the second conductive type portion is smaller than or equal to the length of the second line portion.

The printed-circuit board with a right-angled trace made by the manufacturing method of the invention has a P-type and N-type semi-conductive right-angled interface. The interface does not reflect signals transmitting from the first line portion to the second line portion and via the right-angled portion so as to reduce signal reflection interference. The right-angled line arrangement also shortens the connection distance and reduces the circuit board dimensions.

BRIEF DESCRIPTION OF THE DRAWINGS

The invention will become more fully understood from the detailed description given hereinbelow. However, this description is for purposes of illustration only, and thus is not limitative of the invention, wherein.

DETAILED DESCRIPTION OF THE INVENTION

Figure 1A:
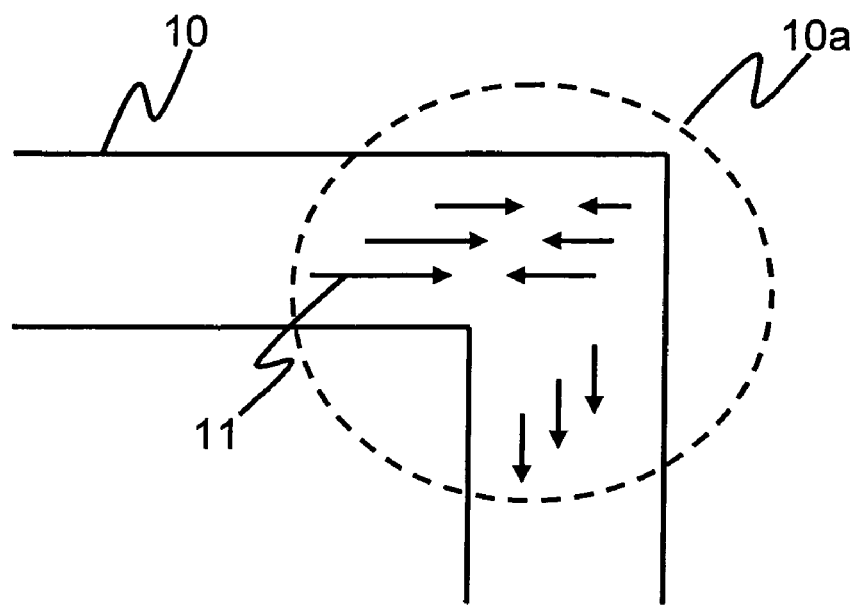
FIG. 1A is a descriptive view of signal reflection at a right-angled circuit portion of prior art.
Figure 1B:
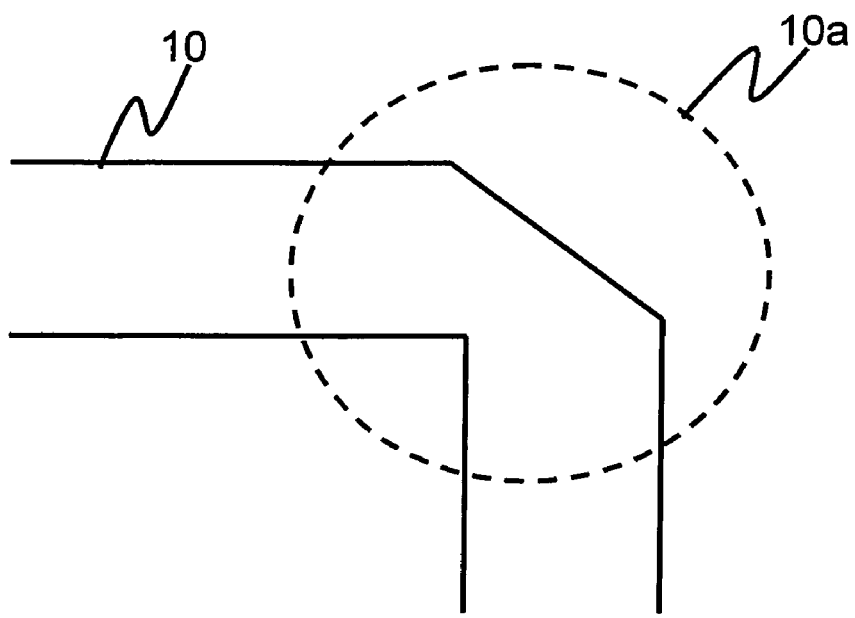
FIG. 1B is a right-angled trace arrangement of prior art.
Figure 1C:
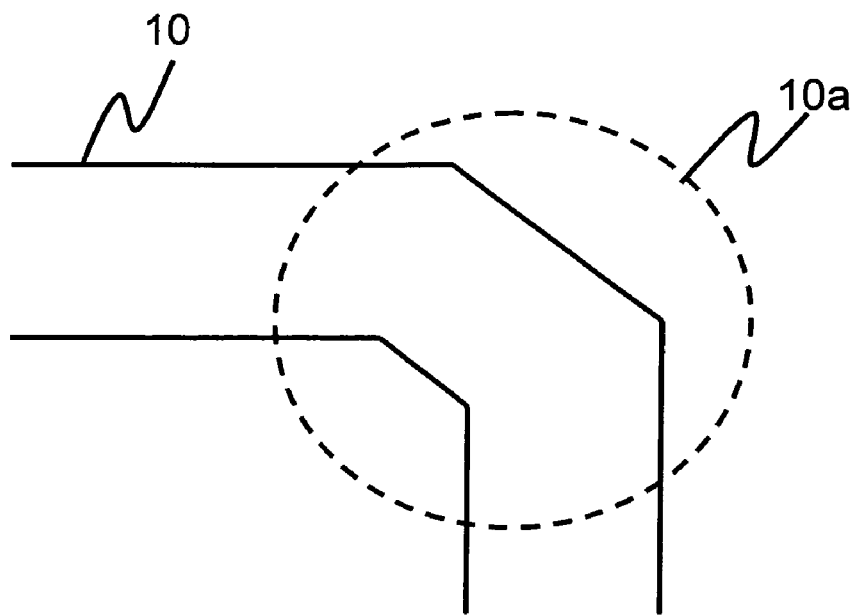
FIG. 1C is another right-angled trace arrangement of prior art.
Figure 1D:
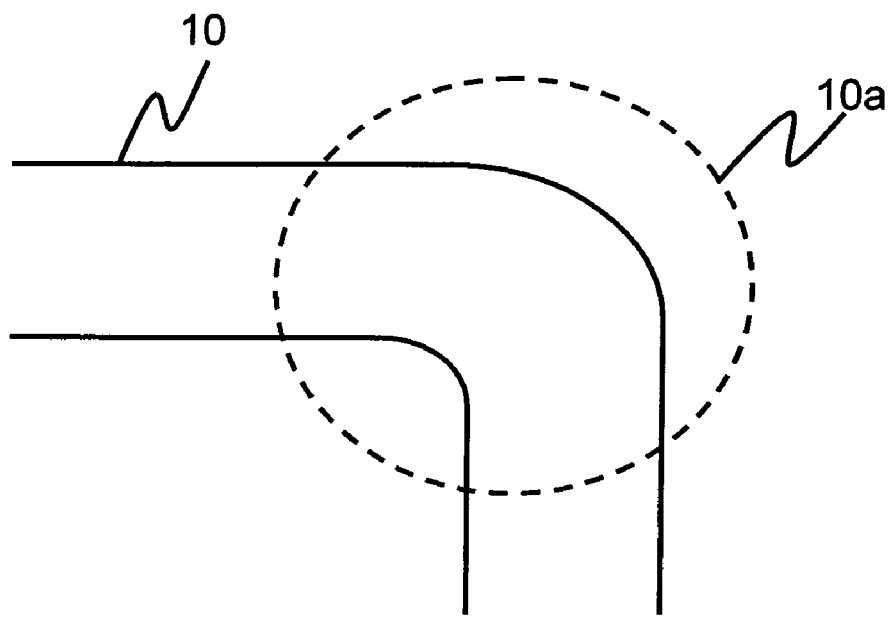
FIG. 1D is further another right-angled trace arrangement of prior art.
Figure 2A:
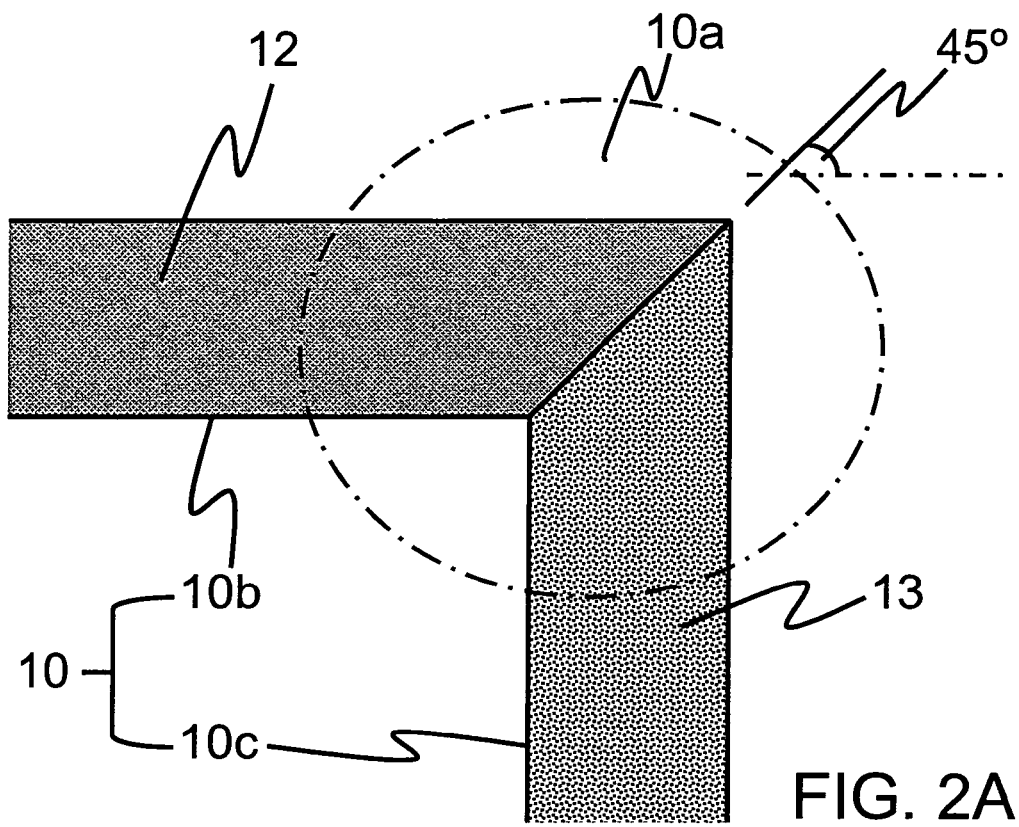
FIG. 2A is a right-angled trace arrangement of the invention.

As shown in FIG. 2A, a right-angled trace arrangement of the invention, the trace 10 includes a first line portion 10b and a second line portion 10c. The two line portions form a right-angled portion 10a.

After a first lithography and ion implant, a first conductive type portion, i.e. a P-type semi-conductive layer, 12 is formed on the first line portion 10b. Then forming a photoresist layer on the first and the second line portions 10b, 10c. After a second lithography and ion implant, using a mask to shield the P-type semi-conductive layer 12 of the first line portion 10b; and to form a second conductive type portion, i.e. a N-type semi-conductive layer, 13 on the second line portion 10c. So that, signals coming from the first line portion 10b and passing to the second line portion 10c are not reflected at the right-angled portion 10a so as to reduce the reflection interference. The P-type semi-conductive layer 12 and the N-type semi-conductive layer 13 have 45-degree interfaces. In other words, the first line portion 10b and the second line portion 10c has interfaces meeting to each other so as to transmit signals from the first line portion 10b to the second line portion 10c.

Figure 2B:
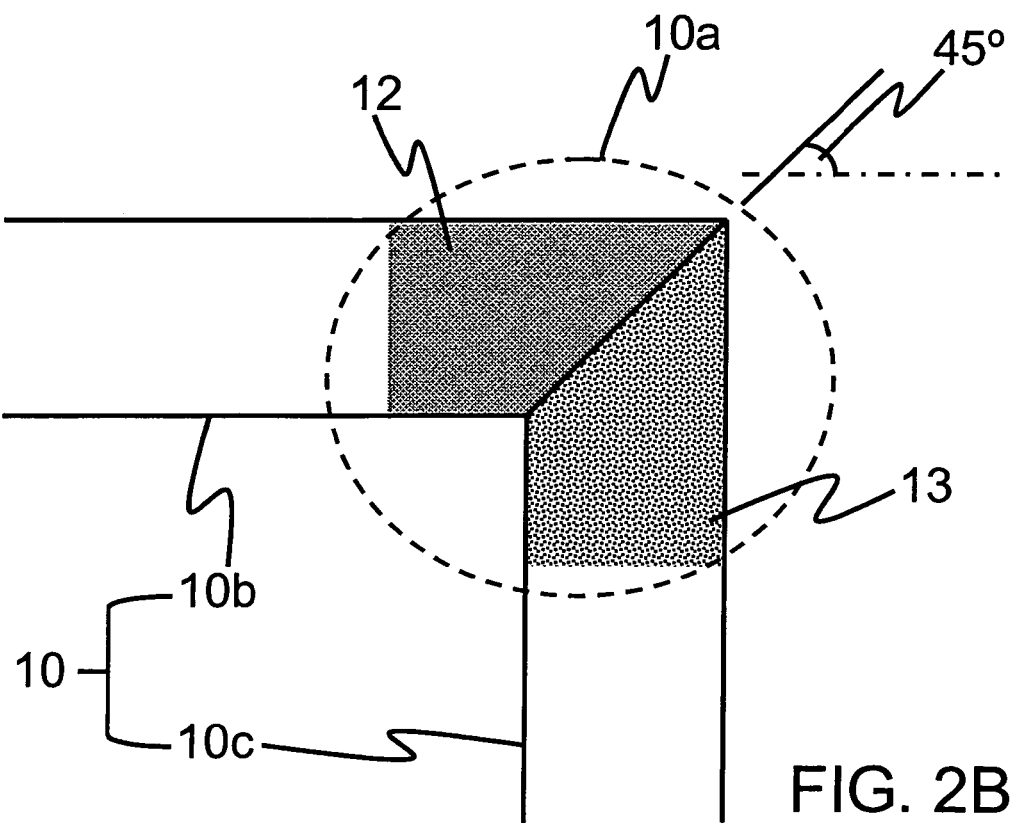
FIG. 2B is another right-angled trace arrangement of the invention.

The right-angled trace is applied to those noise-sensitive portions, such as high frequency oscillator, crystal oscillator or others, on a printed circuit board, or applied to the whole circuit. The P-N semi-conductive layers can cover the right-angled portion 10b or extend to the whole line. As shown in FIG. 2A, the length of the first conductive type portion 12 is the same as that of the first line portion 10b. As shown in FIG. 2B, the length of the first conductive type portion 12 is shorter than that of the first line portion 10b. The rest of the first line portion 10b besides the right-angled portion 10a remains original metal line (such as copper foil).

Figure 3A:
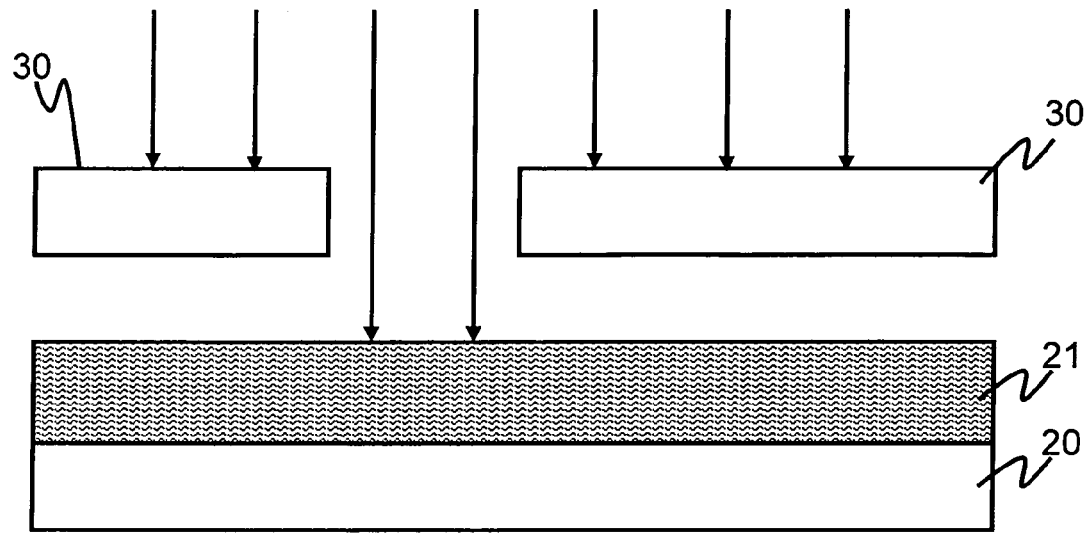
FIGS. 3A to 3D show the process diagrams for fabricating the circuit board of the invention.
Figure 3B:
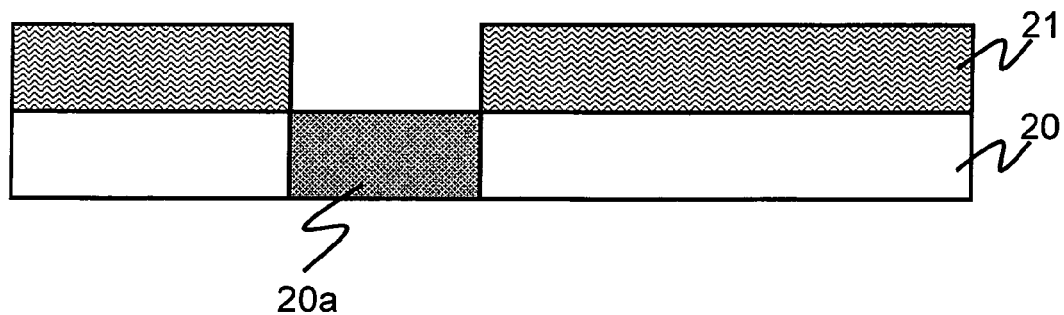

FIGS. 3A to 3D are show the process diagrams for fabricating the circuit board of the invention. As shown in FIG. 3A, the substrate 20 is a semi-conductor material. First, forming a photoresist layer 21 on the substrate. Then applying a first lithography by shielding the photoresist layer 21 with a mask 30. Exposing the photoresist layer 21 to light and changing its solubility (for a P-type photoresist). Washing with chemical agent (such as acid or alkali) to remove a part of the photoresist layer 21 and getting the area for ion implant. Then implanting ions to finish a P-type semi-conductive layer 20a in the substrate 20.

Figure 3C:
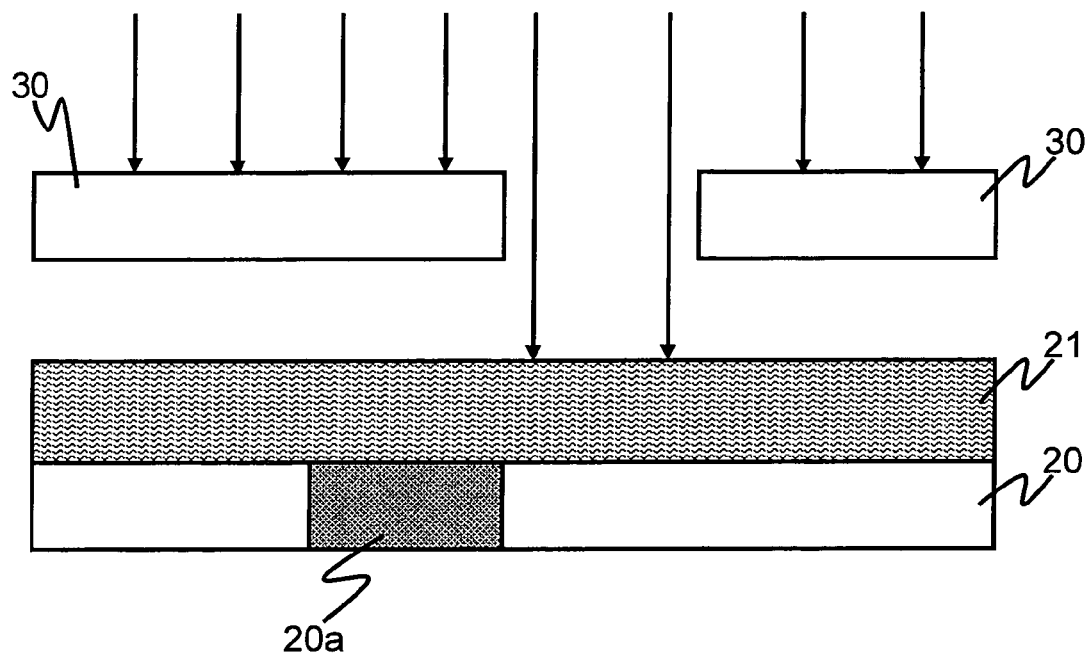
Figure 3D:
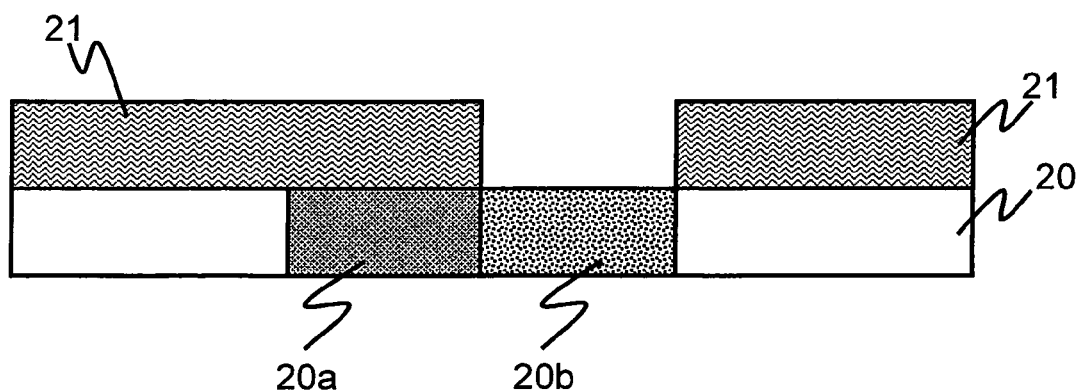

Then, as shown in FIG. 3C; forming again a photoresist layer 21 on the substrate 20. Applying a second lithography by shielding the photoresist layer 21 with a mask 30. Exposing the photoresist layer 21 to light and changing its solubility (for a P-type photoresist). Washing with chemical agent (such as acid or alkali) to remove a part of the photoresist layer 21 and getting the area, as shown in FIG. 3D, for ion implant. Then implanting ions to finish a N-type semi-conductive layer 20b in the substrate 20. Finally, removing the photoresist layer 21 to finish the trace with P-N semi-conductive layers.

Figure 4:
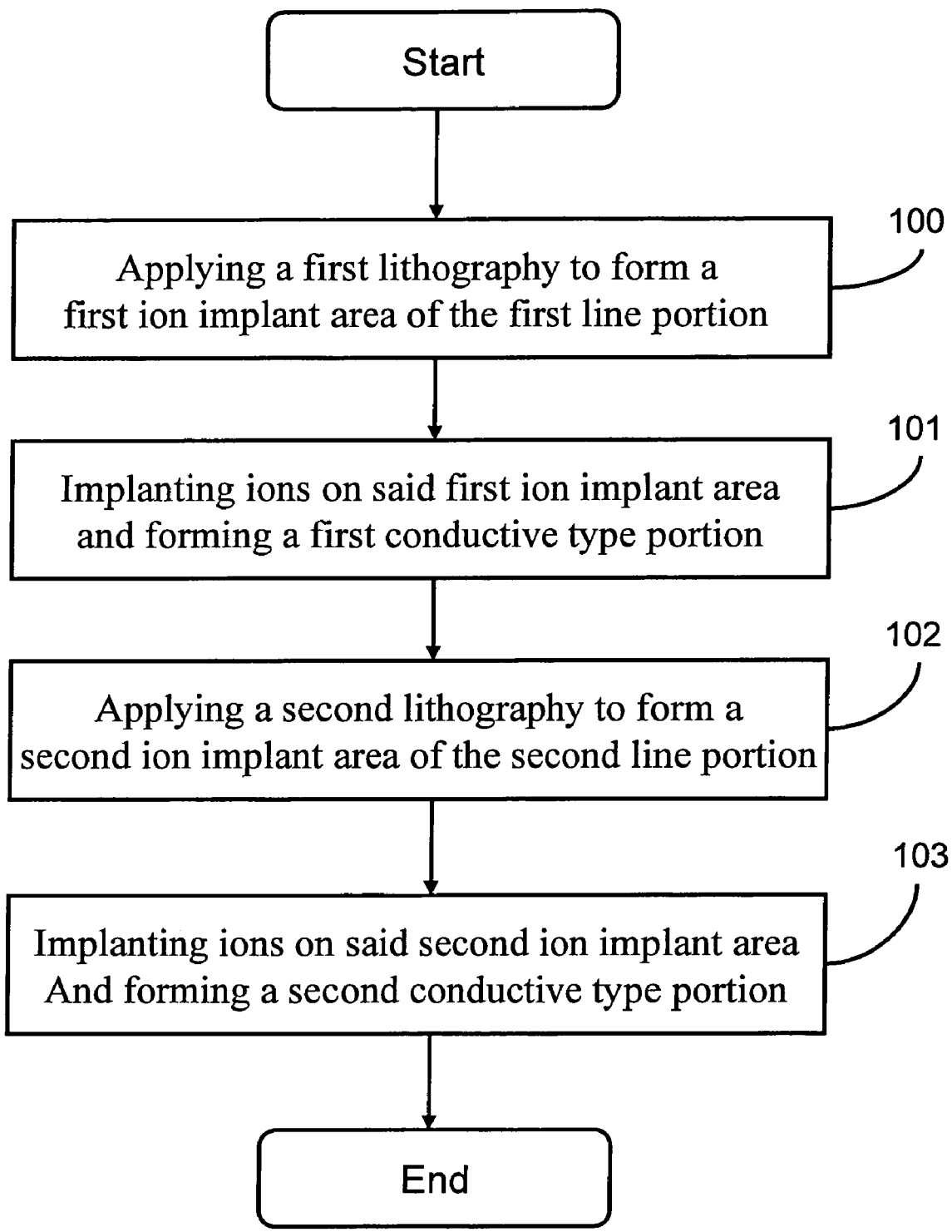
FIG. 4 is a flowchart of method of the invention.

FIG. 4 shows a flowchart of method of the invention. First, applying first lithography on a semi-conductor substrate to form a first ion implant area of a first line portion of a right-angled portion (step 100). The process of first lithography includes the following steps: preparing a mask of circuit; forming a photoresist layer on the substrate (the photoresist is a P-type material that is soluble by chemical agent after exposure, or an N-type material has reversed characteristics that the un-exposed area is soluble); shielding the second line portion of the right-angled portion by the mask; exposing the photoresist layer of the first line portion; and removing a part of the photoresist layer and getting an area for ion implant of the first line portion by using chemical agent.

Then, implanting ions on the first ion implant area to form a first conductive type portion, such as a P-type semi-conductive layer (step 101); applying second lithography to form a second ion implant area of the second line portion of the right-angled portion (step 102).

The process of second lithography includes the following steps: forming a photoresist layer on the line; shielding the first line portion of the right-angled portion by the mask; exposing the photoresist layer of the second line portion; and removing a part of the photoresist layer and getting an area for ion implant of the second line portion by using chemical agent; further, implanting ions on the second ion implant area to form a second conductive type portion, such as a N-type semi-conductive layer (step 103).

The printed-circuit board made by the right-angled trace manufacturing method has a P-type and N-type semi-conductive right-angled interface that does not reflect signals transmitting from the first line portion to the second line portion and via the right-angled portion so as to reduce the reflection interference. The right-angled line arrangement also shortens the connection distance and reduces the circuit board dimensions.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for making a right-angled trace in which a semi-conductive interface is formed between a first line portion and a second line portion of a right-angled portion, comprising:

applying a first lithography to form a first ion implant area of said first line portion;

implanting ions on said first ion implant area and forming a first conductive type portion;

applying a second lithography to form a second ion implant area of said second line portion;

implanting ions on said second ion implant area and forming a second conductive type portion; and wherein said first and said second conductive type portions form an interface at said right-angled portion, and said interface has a 45-degree angle from said first line portion.

2. The method for making a right-angled trace according to claim 1 wherein said first conductive type portion is a P-type semi-conductive layer.

3. The method for making a right-angled trace according to claim 1 wherein said second conductive type portion is an N-type semi-conductive layer.

4. The method for making a right-angled trace according to claim 1 wherein said first lithography comprises steps of:
   forming a photoresist layer on said line portions;
   shielding said second line portion of said right-angled portion with a mask and exposing said photoresist layer of said first line portion; and
   removing a part of said photoresist layer of said first line portion.

5. The method for making a right-angled trace according to claim 4 wherein said photoresist is a P-type material.

6. The method for making a right-angled trace according to claim 1 wherein said second lithography comprises steps of:
   forming a photoresist layer on said lines;
   shielding said first line portion of said right-angled portion with a mask and exposing said photoresist layer of said second line portion; and
   removing a part of said photoresist layer of said second line portion.

7. The method for making a right-angled trace according to claim 6 wherein said photoresist is a P-type material.

8. The method for making a right-angled trace according to claim 1 wherein length of said first conductive type portion is smaller than length of said first line portion.

9. The method for making a right-angled trace according to claim 8 wherein length of said second conductive type portion is smaller than length of said second line portion.

10. The method for making a right-angled trace according to claim 1 wherein length of said first conductive type portion is equal to length of said first line portion.

11. The method for making a right-angled trace according to claim 10 wherein length of said second conductive type portion is equal to length of said second line portion.

12. A printed circuit board with a right-angled trace, comprising:
   a substrate of a semi-conductive material; and
   a right-angled line layer, formed on said substrate, that comprises a first line portion having a first conductive type portion; and a second line portion, connected to said first line portion, having a second conductive type portion; said first and said second conductive type portions forming a semi-conductive interface; and
   wherein said semi-conductive interface is formed in a 45-degree angle from said first line portion.

13. The printed circuit board with right-angled trace according to claim 12 wherein said first conductive type portion is a P-type semi-conductive layer.

14. The printed circuit board with right-angled trace according to claim 12 wherein said second conductive type portion is an N-type semi-conductive layer.

15. The printed circuit board with right-angled trace according to claim 12 wherein length of said first conductive type portion is smaller than length of said first line portion.

16. The printed circuit board with right-angled trace according to claim 15 wherein length of said second conductive type portion is smaller than length of said second line portion.

17. The printed circuit board with right-angled trace according to claim 12 wherein length of said first conductive type portion is equal to length of said first line portion.

18. The printed circuit board with right-angled trace according to claim 17 wherein length of said second conductive type portion is equal to length of said second line portion.

* * * * *